United States Patent [19]

Yoshida

[11] Patent Number: 4,681,982
[45] Date of Patent: Jul. 21, 1987

[54] LIGHT-ELECTRICITY CONVERSION SEMICONDUCTOR DEVICE

[75] Inventor: Susumu Yoshida, Itami, Japan

[73] Assignee: Mitsubishi Denki Kabushiki Kaisha, Tokyo, Japan

[21] Appl. No.: 860,799

[22] Filed: May 8, 1986

[30] Foreign Application Priority Data

May 8, 1985 [JP] Japan .................................. 60-97031

[51] Int. Cl.$^4$ ........................................... H01L 31/06
[52] U.S. Cl. ....................................... 136/249; 357/30
[58] Field of Search ...................... 136/249 TJ; 357/30

[56] References Cited

U.S. PATENT DOCUMENTS

| | | | |
|---|---|---|---|
| 4,094,704 | 6/1978 | Milnes | 136/244 |
| 4,295,002 | 10/1981 | Chappell et al. | 136/244 |
| 4,400,868 | 8/1983 | Antypas et al. | 29/572 |
| 4,547,622 | 10/1985 | Faw et al. | 136/249 TJ |

FOREIGN PATENT DOCUMENTS 58-220475 12/1983 Japan ................................... 136/249

OTHER PUBLICATIONS

"First Results on the Development of a Thin Film CdSe MIS Solar Cell", by D. Bonnett, Photovoltaic Solar Energy Conference, Sep. 27-30, 1977, pp. 631-637 (Reidel Publishing Co.).

"Stacked Multiple-Bandgap Solar Cells Prepared by CVD Techniques", by R. D. Dupuis et al, *Fourteenth IEEE Photovoltaic Specialists Conference (1980) pp. 1388-1389.*

John C. C. Fan et al, "Optimal Design of High-Efficiency Tandem Cells", *Proc. 16th IEEE Photovoltaic Specialists Conf.*, pp. 692-701 (1982).

John C. C. Fan et al, "GaAs/Ge/Si Solar Cells", *Proc. 17th IEEE Photovoltaic Specialists Conf.*, pp. 440-444 (1984).

*Primary Examiner*—Aaron Weisstuch
*Attorney, Agent, or Firm*—Birch, Stewart, Kolasch & Birch

[57] ABSTRACT

A semiconductor light-electricity conversion device, includes: a Group III-V compound semiconductor region having a pn junction therein and including gallium and arsenic; a silicon region having a pn junction; a zinc selenide layer inserted between said two regions; and a plurality of electrodes for outputting light generated current from said two regions.

1 Claim, 8 Drawing Figures

LIGHT-ELECTRICITY CONVERSION SEMICONDUCTOR DEVICE

The present invention relates to a semiconductor light-electricity conversion device such as a solar cell.

BACKGROUND OF THE INVENTION

FIG. 2 shows a prior art semiconductor light-electricity conversion device as shown on pp. 692–701 of the *Proceedings of the* 16th *IEEE Photovoltaic Specialists Conference* (1982).

In FIG. 2, the reference numeral 1 designates an n-type silicon substrate (hereinafter referred to as "n-Si substrate"). The numeral 2 designates a p-type silicon layer produced on the n-Si substrate 1. The numeral 3 designates a germanium layer produced on the p-Si layer 2. The numeral 4 designates an n-type gallium arsenide (GaAs) layer produced on the germanium (Ge) layer 3. The numeral 5 designates a p-type gallium arsenide layer produced on the n-GaAs layer 4. The numeral 6 designates a silicon nitride film having a thickness of 600 to 800 Å produced on the p-GaAs layer 5. The numerals 7 and 8 designate electrodes provided in ohmic contact with the p-GaAs layer 5 and the n-Si substrate 1, respectively.

The device will be operated as follows:

When sun light is projected onto the device from above in FIG. 2, current produced by light-electricity conversion of a relatively short wavelength component between the n-GaAs layer 4 and the p-GaAs layer 5 and by conversion of a relatively long wavelength component between the n-Si substrate 1 and the p-Si layer 2 is outputted from the electrodes 7 and 8.

The Ge layer 3 is deposited on the p-Si layer 2 as an amorphous film by a method such as a vapor plating, and it is treated to have a good crystalline structure by a recrystallization technique such as laser annealing. Furthermore, this Ge layer 3 has the function of enhancing the crystalline structure of the n-GaAs layer 4 deposited thereon because the Ge layer 3 has a lattice constant quite close to that of the n-GaAs layer 4.

In the prior art semiconductor light-electricity conversion device of such a construction, as is apparent from the above description, it is impossible to obtain good crystallinity of the n-GaAs layer 4 if it is produced directly on the p-Si layer 2, and therefore, the Ge layer 3 is provided between the p-Si layer 2 and the n-GaAs layer 4. In this case, however, the Ge layer 3 has a narrower band gap energy than that of silicon (germanium and silicon have band gap energies of 0.66 eV and 1.1 eV, respectively), and it absorbs light of the wavelength region which can be converted by the diode constituted by the n-Si substrate 1 and the p-Si layer 2, whereby the light-electricity conversion is reduced.

Another prior art semiconductor light-electricity conversion device is disclosed in an article "GaAs/Ge/Si SOLAR CELLS", by B-Y Tsaur et al, *Proc.* 17th *IEEE Photovoltaic Specialists Conf.*, pp. 440–444 (1984). In this article it is reported that a light-electricity conversion element comprising GaAs having a pn junction is produced after a germanium layer is coated over the surface of a silicon substrate by electron beam evaporation.

Another prior art device is disclosed in an article "OPTIMAL DESIGN OF HIGH-EFFICIENCY TANDEM CELLS", by John C. C. Fan et al, *Proc.* 16th *IEEE Photovoltaic Specialists Conf.*, pp. 692–701 (1982). In this article it is reported that a light-electricity conversion element comprising GaAs having a pn junction is produced on a Ge layer deposited on the surface of a silicon substrate by an electron beam vapor deposition process, and the EPD (Etch Pit Density) of that element is investigated.

SUMMARY OF THE INVENTION

The present invention is directed toward solving the problems pointed out above, and has for its object to provide a semiconductor light-electricity conversion device having a high total efficiency with a good crystallinity of the n-GaAs layer.

Other objects and advantages of the present invention will become apparent from the detailed description given hereinafter; it should be understood, however, that the detailed description and specific embodiment are given by way of illustration only, since various changes and modifications within the spirit and scope of the invention will become apparent to those skilled in the art from this detailed description.

According to the present invention, there is provided a semiconductor light-electricity conversion device, comprising: a Group III-V compound semiconductor region having a pn junction therein and comprising gallium and arsenic; a silicon region having a pn junction therein; a zinc selenide layer inserted between said two regions; and a plurality of electrodes for outputting the light generated current from said two regions.

DETAILED DESCRIPTION OF THE PREFERRED EMBODIMENTS

Figure 1:
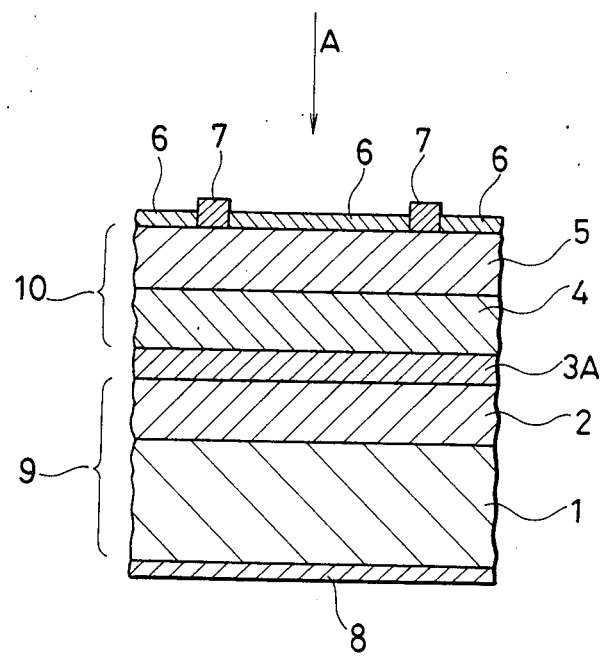
FIG. 1 is a cross-sectional view showing an embodiment of the present invention.
Figure 2:
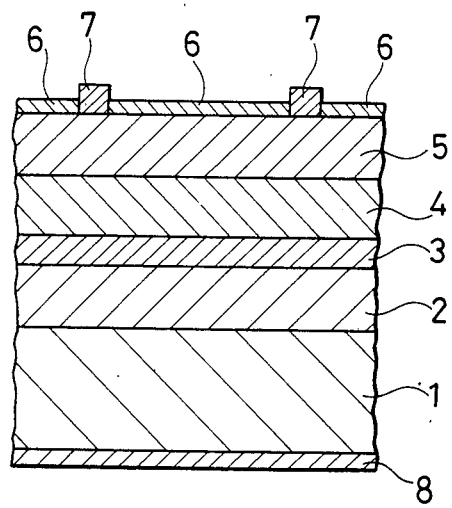
FIG. 2 is a cross-sectional view showing a prior art light-electricity conversion semiconductor device.

In order to explain the present invention in detail, reference will be particularly made to FIG. 1.

In FIG. 1, the reference numeral 1 designates a n-Si substrate, and the numeral 2 designates a p-Si layer produced on the n-Si substrate 1 by such as boron diffusion. The numeral 3A designates a zinc selenide layer of 0.1 to several $\mu$m thickness which is deposited on the p-Si layer 2 by a molecular beam epitaxial method and recrystallized by laser annealing under high pressure. The numeral 4 designates an n-GaAs layer including silicon, selenium, sulfur, tellurium, or a Group IV element deposited on the zinc selenide layer 3A by a gas phase or liquid phase epitaxial growth method. A good crystallinity GaAs layer is obtained because the lattice constant 5.667 Å of zinc selenide is close to the 5.65 Å of GaAs. The numeral 5 designates a p-GaAs layer including a Group II element such as zinc, beryllium, or magnesium produced on the n-GaAs layer 4 by a similar epitaxial growth method. The numeral 6 designates a reflection preventing film of silicon nitride which is produced on the p-GaAs layer 5 by e.g. a plasma CVD method and to which apertures are opened where necessary by photolithography. The numerals 7 and 8 designate electrodes provided in ohmic contact with the P-GaAs layer 5 and the n-Si substrate 1 respectively. The numeral 9 designates a silicon region constituted by the n-Si substrate 1 and the p-Si layer 2. The numeral 10 designates a Group III-V compound semiconductor region including gallium and arsenic constituted by the n-GaAs layer 4 and the p-GaAs layer 5.

In this embodiment, when light such as sun light is projected thereinto from above in FIG. 1, light of relatively short wavelengths is absorbed by the pn junction constituted by the n-GaAs layer 4 and the p-GaAs layer 5 and converted into an electric current, and light of relatively long wavelengths which has penetrated the above described GaAs layers 4 and 5 and ZnSe layer 3A is converted into an electric current by the pn junction constituted by the n-Si substrate 1 and the P-Si layer 2, and light generated current is outputted from the electrodes 7 and 8 through the ZnSe layer 3A. Contrary to the Ge layer 3 which completely absorbs light of the wavelength region which is required for conversion by the silicon regions 1 and 2 in the prior art device, the ZnSe layer 3A of this embodiment has a larger band gap energy (2.67 eV) than that of silicon, and is transparent in the wavelength region in question, whereby the disadvantages of the prior art device are solved.

The GaAs layers 4 and 5 are produced on the ZnSe layer 3A differently from the prior art device, but these GaAs layers 4 and 5 have approximately equal conversion efficiencies as that of the prior art device because they have good crystallinity.

The overall efficiency of this embodiment is increased to a higher level than that of the prior art device.

In the illustrated embodiment GaAs is used for the Group III-V compound semiconductor region 10, but this can be replaced by $Al_xGa_{1-x}As$ (wherein $0<X<1$, and the composition proportion of AlAs to GaAs is $X:1-X$) because a good crystallinity $Al_xGa_{1-x}As$ can be produced on the ZnSe layer 3A.

Figure 3:
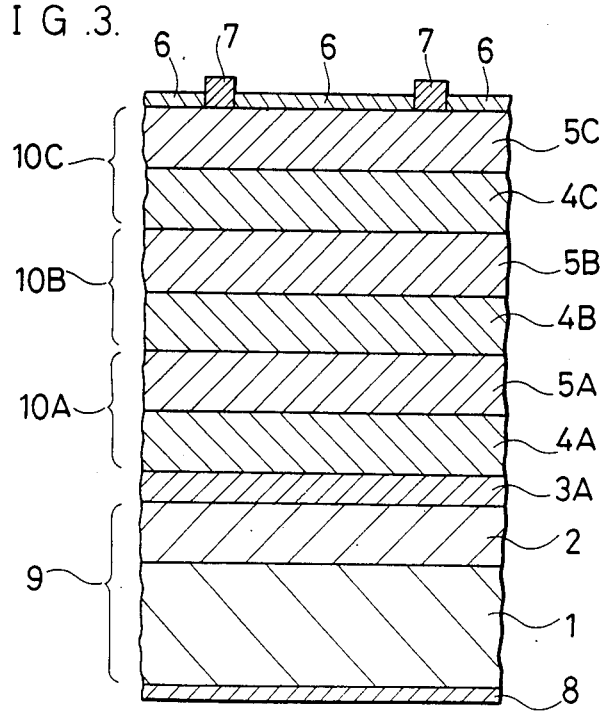
FIGS. 3 to 8 are cross-sectional views each showing different embodiments of the present invention.

Furthermore, as shown on the embodiment of FIG. 3, a plurality of $Al_xGa_{1-x}As$ regions 10A, 10B, 10C can be produced in such a manner that the composition proportion x of Al becomes larger closer to the upper layer, and the n-$Al_xGa_{1-x}As$ layers 4A, 4B, 4C and the p-$Al_xGa_{1-x}As$ layers 5A, 5B, 5C are provided at each of the respective $Al_xGa_{1-x}As$ regions 10A, 10B, 10C one above the other in succession.

In the above illustrated embodiments all the pn junctions are produced in such a manner that the p layer is located above the n layer, but this may be reversed.

Figure 4:
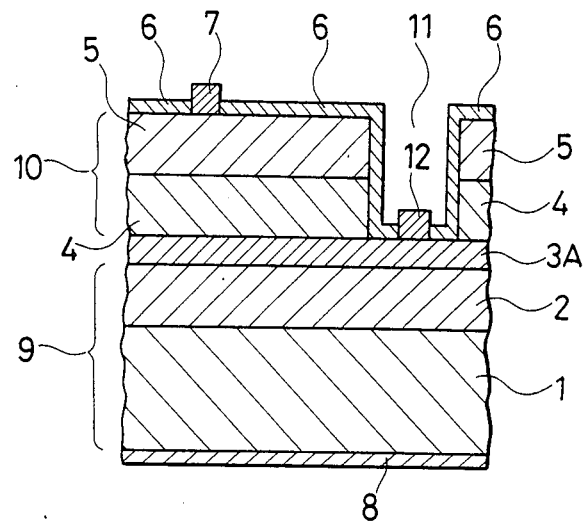

Furthermore, in the above illustrated embodiment all the pn junctions are serially connected, but the pn junctions may be provided in parallel with each other and the currents thereat may be taken out separately by forming a groove 11 in the layers 4 and 5 and providing an electrode 12 in contact with the ZnSe layer 3A as shown in FIG. 4. In this case the polarities of the pn junctions are not required to be in the same direction.

Figure 5:
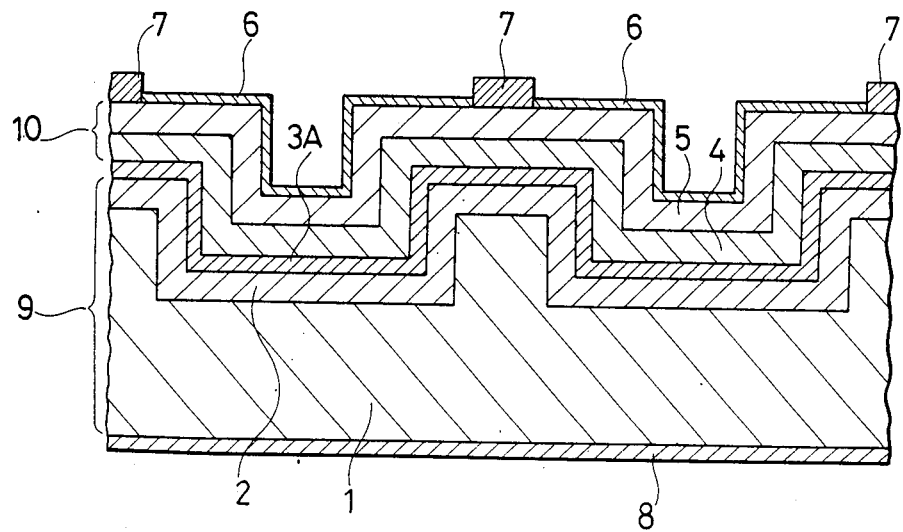

In the illustrated embodiment, the silicon region 9, the GaAs region 10, and the $Al_xGa_{1-x}As$ regions 10A, 10B, 10C are all made flat, but they may also be concave or convex as shown in FIG. 5.

Figure 6:
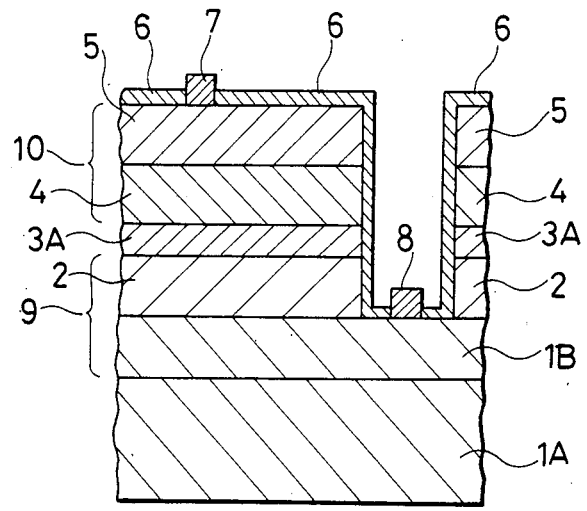

In the illustrated embodiment, the substrate 1 comprises silicon and constitutes a portion of the pn junction, but the substrate may also be of SOS (silicon on sapphire), which comprises a substrate of sapphire 1A and an n-Si layer 1B formed thereon as shown in FIG. 6. In this case an electrode 8 can be provided similarly as shown in FIG. 4.

Figure 7:
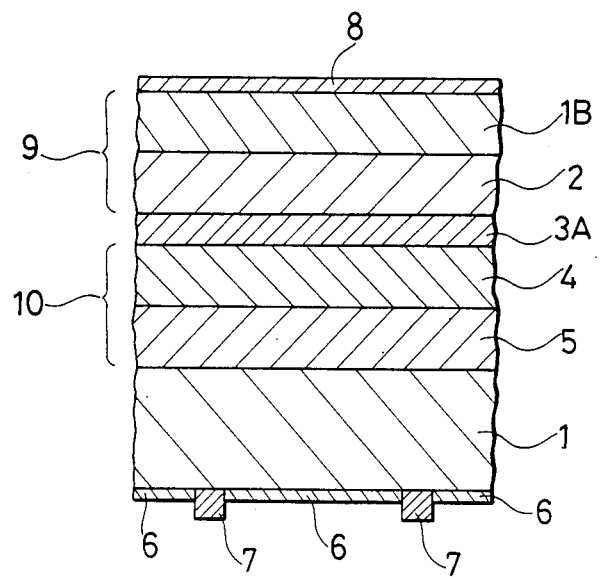

In the illustrated embodiment, the Si region 9 overlies the substrate 1, but the Group III-V compound semiconductor region 10 may also overlie the substrate 1 as shown in FIG. 7. In this case, however, the substrate 1 comprises a material such as ZnSe having an absorption band edge at the shorter wavelength side than GaAs, $Al_xGa_{1-x}As$, Si, and light such as sun light is projected from below in the figure. Such a device is produced, for example, by starting with a thick n-Si substrate and then depositing in sequence the lower layers 2, 3A, 4, 5, 1, 6, 7, and then forming an electrode 8 on the n-Si substrate.

Figure 8:
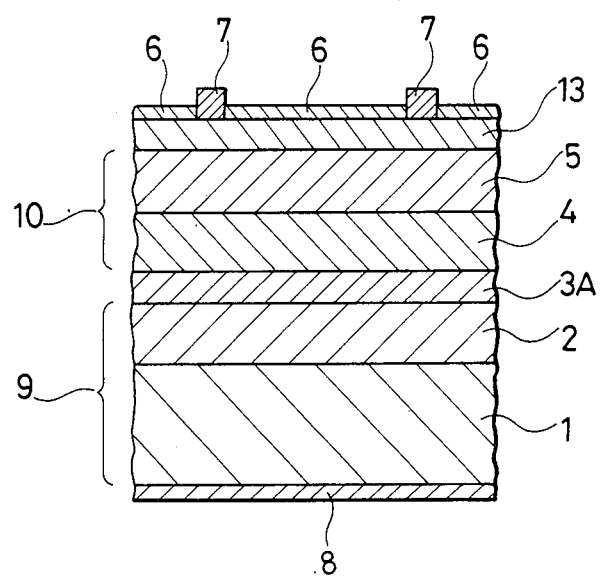

Furthermore, although electrode 7 is directly connected to the p-GaAs layer 5 in FIG. 1, there arises a resistance in the transverse direction between the electrode 7 and the portions of the p-GaAs layer 5 where the electrode 7 does not exists. In order to avoid this, a p-$Al_xGa_{1-x}As$ layer 13 which comprises material having a light absorption band edge at the shorter wavelength side than the layer 5 and having a small resistivity may be formed on the p-GaAs layer 5, as shown in FIG. 8.

As is evident from the foregoing description, according to the present invention, a zinc selenide layer is inserted between the silicon region and the Group III-V compound semiconductor region, thereby enabling transmission of light of that wavelength region which is required for the light-electricity conversion at the pn junction of the silicon region, and improving the crystallinity of the Group III-V compound semiconductor region, resulting in the enhancement of the overall light-electricity conversion efficiency.

What is claimed is:

1. A semiconductor light-electricity conversion device, comprising:

a Group III-V compound semiconductor region having a pn junction therein and comprising gallium and arsenic;

a silicon region having a pn junction, said two regions positioned in optical series relation;

a zinc seleniide layer inserted between said two regions; and a plurality of electrodes for outputting light generated current from said two regions.

* * * * *